United States Patent [19]

Cobaugh et al.

[11] 4,077,694

[45] Mar. 7, 1978

[54] CIRCUIT BOARD CONNECTOR

[75] Inventors: Robert Franklin Cobaugh, Elizabethtown; James Ray Coller, Mechanicsburg, both of Pa.

[73] Assignee: AMP Incorporated, Harrisburg, Pa.

[21] Appl. No.: 682,921

[22] Filed: May 4, 1976

Related U.S. Application Data

[63] Continuation of Ser. No. 589,971, Jun. 24, 1975, abandoned, which is a continuation of Ser. No. 445,736, Feb. 25, 1974, abandoned, which is a continuation-in-part of Ser. No. 439,501, Feb. 4, 1974, abandoned, which is a continuation-in-part of Ser. No. 407,402, Oct. 17, 1973, abandoned.

[51] Int. Cl.[2] .......... H05K 1/07

[52] U.S. Cl. .......... 339/176 MP

[58] Field of Search .......... 339/17 R, 17 C, 17 L, 339/17 LM, 17 M, 176 MP, 176 MF, 217 R, 217 S, 221 R, 221 M

[56] References Cited

U.S. PATENT DOCUMENTS

| | | | |
|---|---|---|---|
| 3,069,652 | 12/1962 | Greco | 339/176 MP |
| 3,464,054 | 8/1969 | Mansfield | 339/176 MP |
| 3,671,917 | 6/1972 | Ammon et al. | 339/17 L |
| 3,720,903 | 3/1973 | Schor | 339/17 L |

FOREIGN PATENT DOCUMENTS

| | | | |
|---|---|---|---|
| 1,640,392 | 2/1971 | Germany | 339/176 MP |

*Primary Examiner*—Roy Lake
*Assistant Examiner*—Neil Abrams
*Attorney, Agent, or Firm*—Donald W. Phillion

[57] ABSTRACT

A circuit board connector having a plurality of pairs of contacts arranged in a row and with each contact having a "C" shaped portion. Each pair of contacts is mounted securely at first ends thereof in a circuit board with the backs, or closed sides, of the "C" shaped portion facing each other and designed to receive the edge of a second circuit board inserted therebetween. The free end of each contact has an ear-like element extending outwardly from the board to which the contacts are secured. A connector housing fits over the pairs of contacts after they have been secured in the board. Inside the housing tabs are provided, behind which tabs the ears of the contacts are positioned, thereby prestressing each pair of contacts apart. The housing is also designed so that the side walls thereof press against a dimple or finger-like tang formed near the base of each contact, thereby forcing the contacts of each pair of contacts together and further enhancing the prestressing of each pair of contacts.

11 Claims, 20 Drawing Figures

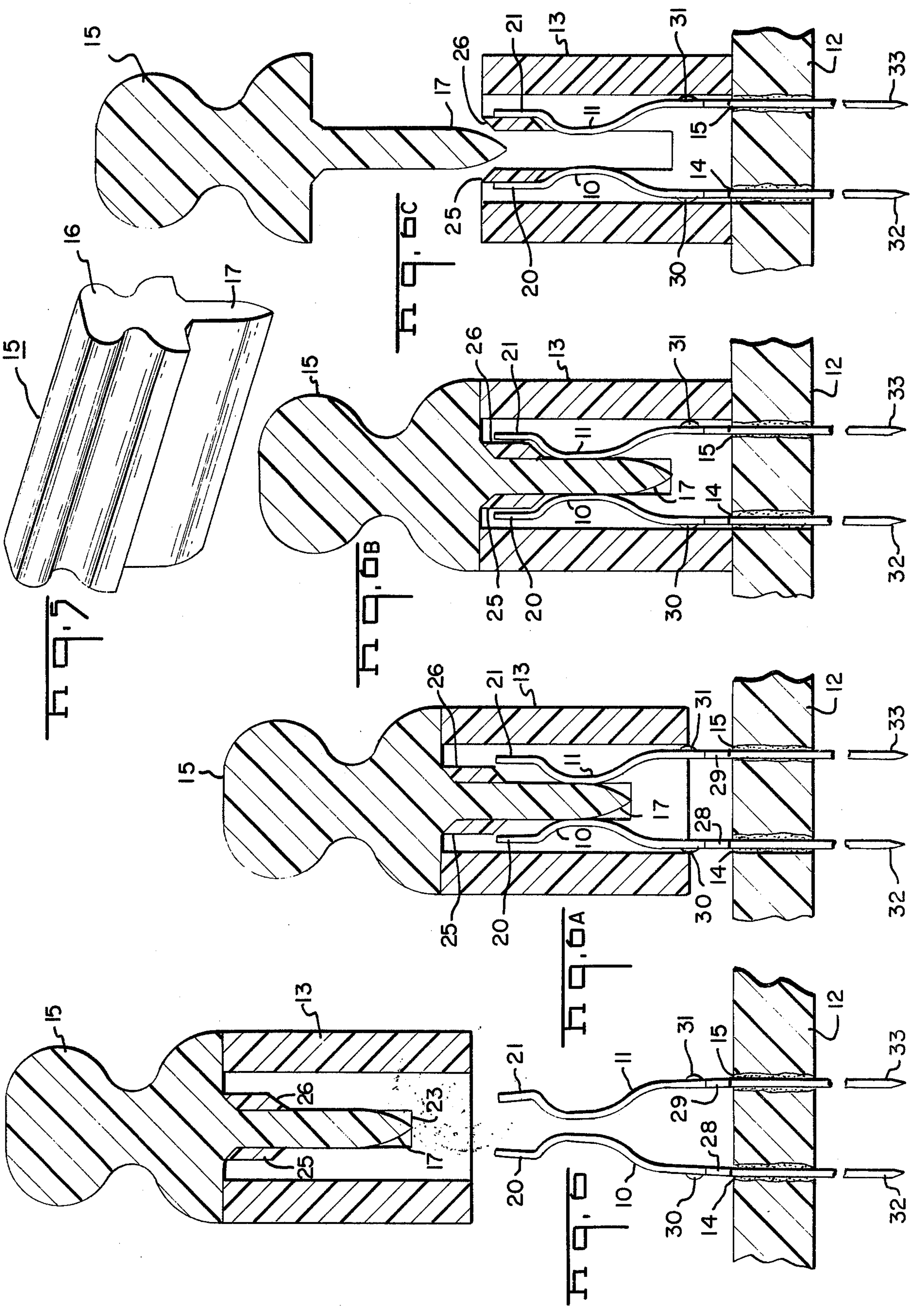

SECTION A-A OF FIG. 15
200
201
202
203
204
205
206
207
209
210
212
213
215
216
219
221
223
224
228
230
231
232
240
241
242
A
A

CIRCUIT BOARD CONNECTOR

CROSS-REFERENCE TO RELATED APPLICATIONS

This application is a continuation of application Ser. No. 589,971 filed June 24, 1975, by James Ray Coller and Robert Franklin Cobaugh and entitled "Circuit Board Connector", now abandoned, which is a continuation of application Ser. No. 445,736 filed Feb. 25, 1974, by James Ray Coller and Robert Franklin Cobaugh and entitled "Circuit Board Connector", now abandoned, which is in turn a continuation-in-part of application Ser. No. 439,501 filed Feb. 4, 1974, by James Ray Coller and Robert Franklin Cobaugh and entitled "Circuit Board Connector", now abandoned, which is in turn a continuation-in-part of application Ser. No. 407,402 filed Oct. 17, 1973, by James Ray Coller and Robert Franklin Cobaugh and entitled "Circuit Board Connector", now abandoned.

BACKGROUND OF THE INVENTION

This invention relates generally to connectors for establishing a connection between mother and daughter boards and more particularly to a connector assembly in which the metal contacts of the connector are soldered, or otherwise secured, in the mother board before the plastic connector housing is installed, thereby eliminating heat damage to the housing during the soldering operation.

In most prior art connectors designed to connect a daughter board to a mother board, the connector is completely assembled before it is mounted on the mother board. Subsequently, after mounting the connector on the mother board, the contacts are then soldered to the mother board, often resulting in deformation of the connector housing owing to the heat of soldering. To solve this problem connectors have been designed in which the contacts thereof are soldered to the mother board before the connector housing is installed. The connector housing is then installed by snapping it over the contacts already soldered in the mother board. It can be seen that in this type of connector the circuit board in which the contacts are secured is in fact a part of the connector. The total connector is a combination of the contacts, the circuit board in which the contacts are secured, and the connector housing. However, it is usually desirable to prestress the contacts in the connector so that when a mating male terminal is inserted in the connector it will be gripped in said connector by a firmer and more constant force.

Unfortunately it is difficult to obtain reliable long term prestressing of the contacts in those connectors in which the contacts are first secured in the mother board. The prestressed contacts frequently become relaxed after a time so that the electrical contact made with an inserted male terminal is derogated. A further disadvantage of prior art connectors in which the contacts are secured to a mother board first occurs when the number of contacts is large. In such structures the force required to snap the housing over the contacts can also be large, sometimes prohibitively so.

BRIEF STATEMENT OF THE INVENTION

It is a primary object of the invention to provide a reliable connector with prestressed contacts, in which said contacts are first inserted and then soldered into a mother board before the connector housing is installed.

A second object of the invention is to provide a reliable connector, with prestressed contacts, in which said contacts are inserted and soldered into a printed circuit board before the connector housing is installed over the connectors, thereby eliminating heat damage to the plastic connector housing, and in which each of said contacts has a dimple formed on the outside thereof, a short distance above the printed circuit board surface, and pressing against the wall of the connector housing, when said connector housing is installed, so as to provide a support for each of said contacts along a substantial length thereof, thereby relieving the leverage strain caused by the contact being supported solely in the printed circuit board.

A third purpose of the invention is to provide a connector, having pairs of prestressed contacts, in which the pairs of contacts are first inserted preferably by press fitting a printed circuit board, and then subsequently prestressed by structure within the connector housing as said housing is installed over said pairs of contacts, and in which each of said pairs of contacts has a protuberance, such as a dimple or a tang, extending outwardly from the base of the contact, just above the surface of the printed circuit board, and pressing into the side of the housing installed thereover for the purpose of effectively extending that length of the contact which is secured, thereby relieving undue strain upon that portion of the printed circuit board in which the contact is mounted.

A fourth object of the invention is the improvement generally of connectors of the type in which the contacts thereof are secured to a printed circuit board before the housing is installed over said contacts.

In accordance with the invention there is provided a connector comprising a housing, a plurality of pairs of contacts which are retained therein, and a printed circuit board or other suitable base in which said contacts are secured. Each of the pairs of contacts are inserted in a printed circuit board and are then soldered (or otherwise secured, as by a press fit) in place on said printed circuit board before the connector housing is installed. Each pair of contacts comprises a board engaging portion such as a presoldered portion which fits within an aperture in the printed circuit board and which provides the means for soldering said contact to the printed circuit board. Further, each contact of each pair of contacts comprises a terminal post attached to said presoldered portion and extending outwardly from a first side of the circuit board, and on the other side of said printed circuit board each contact comprises a shoulder means for seating said contact upon said other side of said circuit board and also an embossment positioned near said shoulder and on the outside of said contact for making physical contact with said housing when said housing is installed over said contacts which are already soldered to the circuit board. Furthermore, each contact comprises a bowed portion which is generally C-shaped which extends from the shoulder of said contact and which is positioned so that the convex side of the "C" of each of the two contacts of each pair of contacts face each other and cooperate with said housing to receive therebetween a male terminal. Each contact further comprises a tab-like and element which extends from the upper end of the C-shaped or bowed portion in a direction away from said other surface of the circuit board. This tab-like element fits behind a holding element provided in the housing. When installed in the housing the said housing will achieve prestressing of the contacts by forcing the two contacts of each pair of contacts towards each other by means of the force exerted on said embossments on said contacts, and also by holding the tabs of said contacts apart by means of said holding elements. The contacts are then prestressed cantilever beams with the fulcrum being positioned at the said embossments.

In accordance with another form of the invention the embossment positioned near the shoulder of the contact is replaced with a finger-like tang which can be stamped out of the contact and which extends outwardly and into a slot formed in the wall of the housing and fashioned to receive said finger-like tang when the housing is snapped over the contacts. Thus, each contact becomes a cantilever-type beam with one end secured in the printed circuit board and also supported at the point above the surface of the printed circuit board where the finger-like tang meets the wall of the housing to relieve excessive strain between the contact and the circuit board.

In accordance with a further feature of the invention, the contacts are separated by partitioning walls, each of which has a portion cut therefrom and which, in combination with each other form the U-shaped slot into which the printed circuit board is inserted. Each of said partitioning walls has a narrowed portion where it joins the main side wall of the connector housing. Also, each of the contacts has a widened portion near the base thereof which extends into the slots formed at the junction of the partitioning walls and the housing side walls. Thus, when the circuit board is not inserted in the connector, the force of the tang upon the side of the housing wall cannot push the contacts sufficiently far away from the housing wall to damage the connection of said contact with said printed circuit board. More specifically, the widened portion of the contact near the base thereof will be physically blocked by the walls of the slots formed at the junction of the partitioning walls and the housing side walls before the contact can move far enough away from the connector housing wall to damage the connection of said contact with said printed circuit board.

In lieu of the slot formed by the partitioning walls, the housing can be constructed to project a blocking member in front of each contact near the base thereof to limit movement of the contact away from the side of the main housing.

To effect the installation of the housing over the contacts secured in the circuit board an appropriate tool is provided. This tool extends through the connector housing and between the contacts of each pair of contacts, spreading each pair of contacts apart so that the housing can slide over said contact and so that said tabs on said contacts can slide up behind said holding elements in said housing to retain said separated contacts in a separated and prestressed condition.

BRIEF DESCRIPTION OF THE DRAWINGS

The afore-mentioned and other objects and features of the invention will be more clearly understood from the following detailed description thereof when read in conjunction with the drawings in which:

FIG. 3 is a view of the structure of FIG. 1 taken along *b—b;*

FIG. 5 shows a tool for installing the housing over the contacts;

FIGS. 6 — 6c show progressive stages of installing the housing over the contacts;

DESCRIPTION OF THE INVENTION

Figure 1:
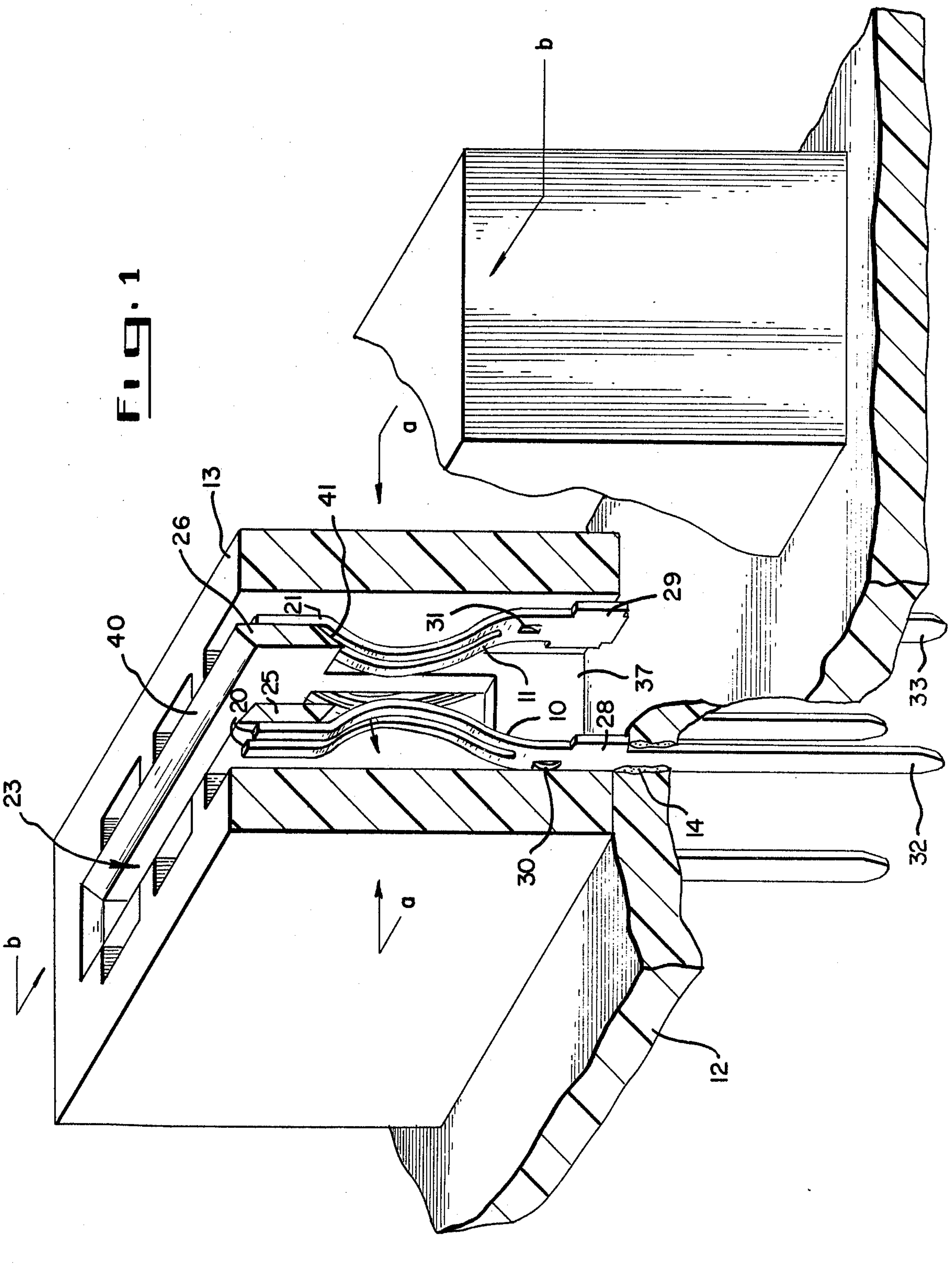
FIG. 1 is a three-dimensional perspective view of the connector and the associated circuit board with portions of the connector housing broken away to show the relationship between the contacts, the connector housing and the circuit board.

Referring now to FIG. 1 the pair of contacts 10 and 11 are shown installed in the printed circuit board 12 and covered by the connector housing 13. The two contacts 10 and 11 are soldered into the board 12 by solder means represented by reference character 14. Other means can be employed, however, to install the contacts 10 and 11 into the board, such as press fitting, for example. As has been discussed hereinbefore, the soldering of the contacts, such as contacts 10 and 11, into board 12 occurs prior to the installation of housing 13 thereon. While the housing 13 in FIG. 1 is shown in the installed position over the contacts 10 and 11 it is to be understood that such housing preferably is installed with the aid of a special tool, such as is shown in FIG. 5. The tool 15 of FIG. 5 is comprised of handle portion 16 and blade portion 17 and is employed in the manner shown in FIGS. 6 through 6*c* to install the housing 13 over contacts 10 and 11.

FIGS. 6 through 6*c* show four stages of installing the housing 13 over the plurality of pairs of contacts such as the pair of contacts 10 and 11 which have already been soldered to the circuit board 12 at solder joints 14 and 15. It is to be understood that FIGS. 6 through 6*c* are end views of a plurality of pairs of contacts, such as contacts 10 and 11, arranged in an aligned relation.

To install the housing 13, the tool 15 is first inserted down into the slot 23 of housing 13 as shown in FIG. 6. It is to be noted that the pairs of contacts must first be installed in the printed circuit board before the connector housing 13 can be installed thereon. More specifically, it is not possible to install the contacts 10 and 11 into the connector housing 13 first before securing said contacts to the printed circuit board 12 since there is no provision in housing 13 to hold the contacts 10 and 11 without the aid of circuit board 12.

After the blade 17 of tool 13 is inserted into the slot 23 of housing 13 the tool and housing assembly is held over the row of pairs of contacts, such as contact pair 10 and 11, as shown in FIG. 6.

The assembly of tool 15 and housing 13 is then lowered onto the row of pairs of contacts as shown in FIG. *6a* in such a manner that each pair of contacts enters into a separate compartment of housing 13 as indicated in FIG. 3 which shows such a separate compartment 36. The blade 17 of tool 15 has a tapered cross-sectional area which functions to spread apart the contacts 10 and 11 and also to spread apart the tab ends 20 and 21 on contacts 10 and 11.

When the housing 13 and tool 15 assembly has been lowered completely over the contacts so that the bottom of the housing 13 rests upon the printed circuit board 12, as shown in FIG. *6b*, the blade 17 will have spread apart the contacts 10 and 11 to the point where the tab ends 20 and 21 are outside the housing elements 25 and 26 of housing 13. Thus, when tool 15 is removed from housing 13 the tabs 20 and 21 will be held in the position shown in FIG. *6c* by holding elements 25 and 26, thus creating a prestressed condition of the contacts 10 and 11.

It is to be noted that the housing 13 can be placed over the contacts after they have been installed in a printed circuit board 12 but before the tool blade 17 has been inserted into the slot 23 of housing 13.

Returning again to FIG. 1 it can be seen that the contacts, such as contacts 10 and 11, have a shoulder portion, such as shoulders 28 and 29, which seat on the surface of the printed circuit board 12 and thereby determine the vertical position of the contacts 10 and 11.

Each contact has a small embossed portion such as embossments 30 and 31 formed thereon. These convex portions or embossments function to friction fit against the inner side of the housing 13 as the housing is moved down upon the contacts, as illustrated in FIGS. 6 through *6c*. Reference is made to FIGS. 6 through *6c* which illustrate from a side view the elements 30 and 31 establishing a force fit with the housing 13.

Figure 2:
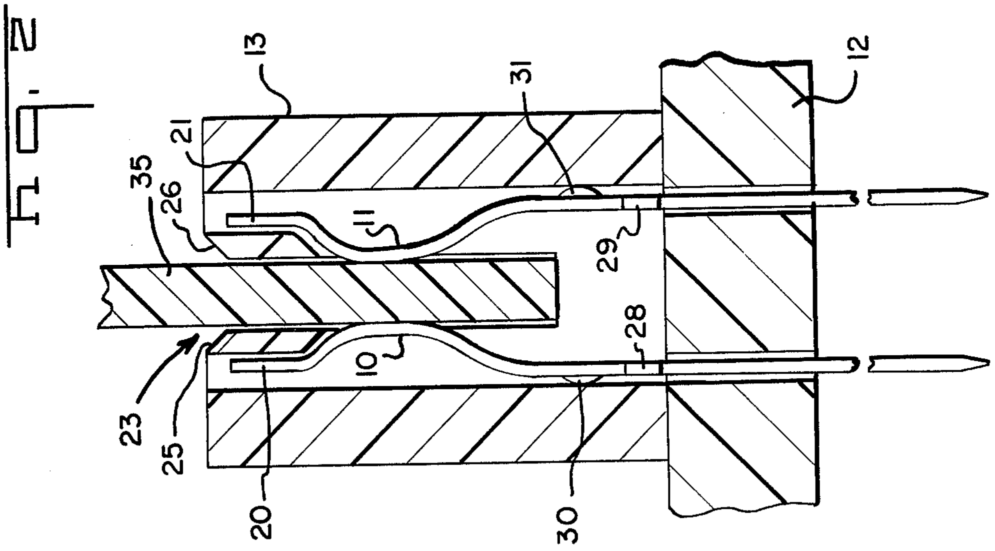
FIG. 2 is an end view of the connector of FIG. 1 taken along *a—a;*

While the embossments function to retain the housing 13 thereon their main purpose is to provide a fulcrum for the C-shaped or bowed portions of the contacts. More specifically, the housing 13 presses against the embossments such as embossments 30 and 31 as shown in FIGS. *6a* and *6c*, to further prestress the bowed or C-shaped portions of the contacts 10 and 11 inwardly towards one another. The said bowed or C-shaped portions are, in effect, cantilever beams with their fulcrum at the embossments 30 and 31. In the absence of such embossments 30 and 31 the C-shaped or bowed portions of the contacts 10 and 11 would still act as cantilever beams but would have their fulcrums at the point where they are secured to the printed circuit board 12. With the longer beam created thereby the amount of force which can be exerted by the contacts 10 and 11 against a circuit board inserted therein (as shown in FIG. 2) is decreased. Furthermore the mechanical bond between the printed circuit board 12 and the contacts 10 and 11 will deteriorate with age so that the prestressed condition of the contacts 10 and 11 against an inserted board will be seriously decreased. Thus, in summary, the embossments 30 and 31 provide not only a shorter cantilever beam effect in contacts 10 and 11 but also provide more support (and over a longer distance on the contacts 10 and 11) for contacts 10 and 11 so that the prestressed condition is substantially more stable.

The post-type terminals, such as post-type terminals 32 and 33 shown in FIGS. 6 - *6c*, can be employed to receive and secure connections by means of wire wrap or other known techniques.

Referring to FIG. 2 there is shown an end view of the assembled connector including the connector housing 13, the contacts 10 and 11 and the printed circuit board 12. Also shown in FIG. 2 is a second printed circuit board 35 which is inserted into the slot 23 of the connector and which makes contact with the pairs of contacts therein, such as the pair of contacts 10 and 11. It will be noted that the contacts 10 and 11 are maintained in a spread-apart relation by the inserted printed circuit board 35 to ensure a good electrical contact between the contacts 10 and 11 and contact pads (not shown) on the edge of the printed circuit board 35. Since contacts 10 and 11 were prestressed before entry of the circuit board 35 therebetween, a good pressure between the contacts 10 and 11 and the edge of the printed circuit board 35 is ensured.

Referring now to FIG. 3 there is shown an internal view of the connector assembly of FIG. 1 taken along the plane *b—b*. In FIG. 3 only one of each pair of contacts is shown owing to the fact that FIG. 3 is taken along the plane *b-b* of FIG. 1.

FIG. 3 shows clearly how each pair of contacts fits into a compartment unique thereto. For example, the contacts 11 and 12, of which only contact 11 is shown, fit into compartment 36 of the connector 13. The compartments, such as compartment 36, are separated by partitions, such as partitions 37, 38, 39 and 41. These partitions 37 through 41 do not extend across the entire connector housing 13 as can be seen in FIG. 1. Rather, they (the partitions 37 - 41) are configured so that they collectively form the slot 23 into which the mating printed circuit board, such as printed circuit board 35 of FIG. 2;, is inserted.

Figure 4:
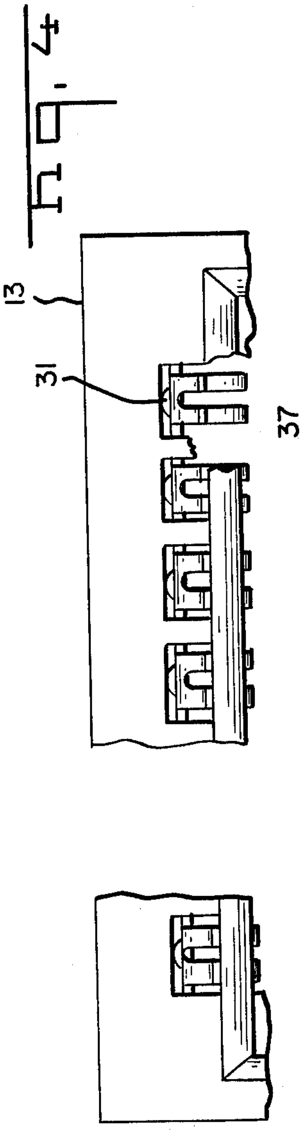
FIG. 4 is a top view of the structure shown in FIG. 3.

In FIG. 4, which shows the top view of the structure of FIG. 3, it can be seen how the small, convex embossments, such as embossment 31 function to make pressure contact with the connector housing 13 to provide a fulcrum for the contacts and further to ensure that said connector housing 13 is securely mounted over said contacts. Also in FIG. 4 it is more evident as to how each of the contacts fits within its particular compartment.

Referring again to FIG. 1 holding elements 25 and 26 extend almost the entire length of the connector housing 13 and along the top of the slot 23. Each of these elements 25 and 26 has a beveled top edge 40 and a beveled bottom edge 41, the two beveled edges being substantially parallel to each other. The primary function of the top beveled edge 38 is to permit easy entry of the mating printed circuit board, such as the printed circuit board 35 of FIG. 2. The bottom beveled edge 41 matches the configuration of those portions of the contacts 10 and 11 which are adjacent thereto.

Figure 7:
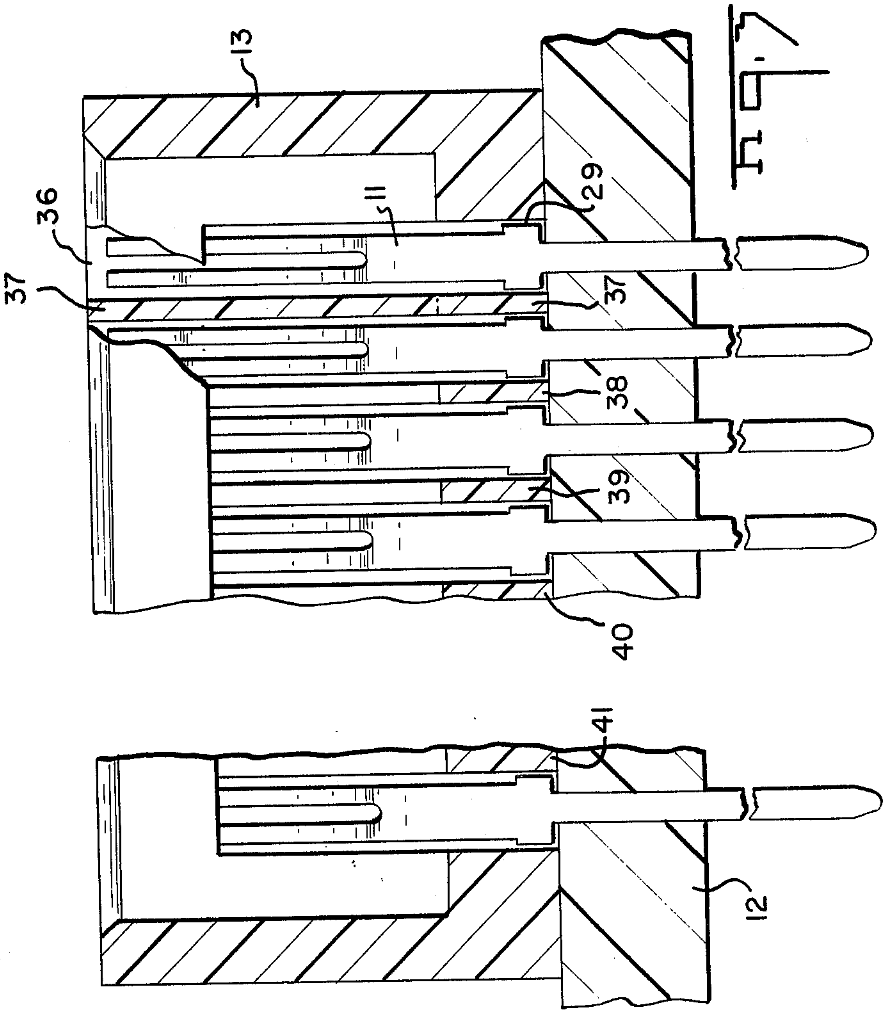
FIG. 7 is a three dimensional perspective view of another form of the connector employing a finger-like tang element which fits into a slot or groove in the wall of the snap-on housing.

Referring now to FIG. 7 there is shown a perspective view of another form of the invention employing finger-like tangs, such as tang 121 on contact 101, which fit into slots, such as slot 120, in the side of the connector housing 100. The finger-like tang 121 is employed in lieu of the embossment or dimple 30 shown in FIGS. 1 through 6. On the mating contact 102 in FIG. 7 a similar tang 166 fits into a similarly shaped slot or notch 155 in the housing wall 156.

Figure 8:
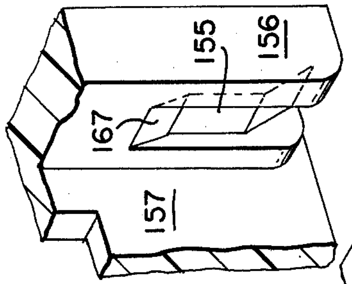
FIG. 8 is an enlarged view of the slot formed in the wall of the housing for receiving the finger-like tang.
Figure 7:
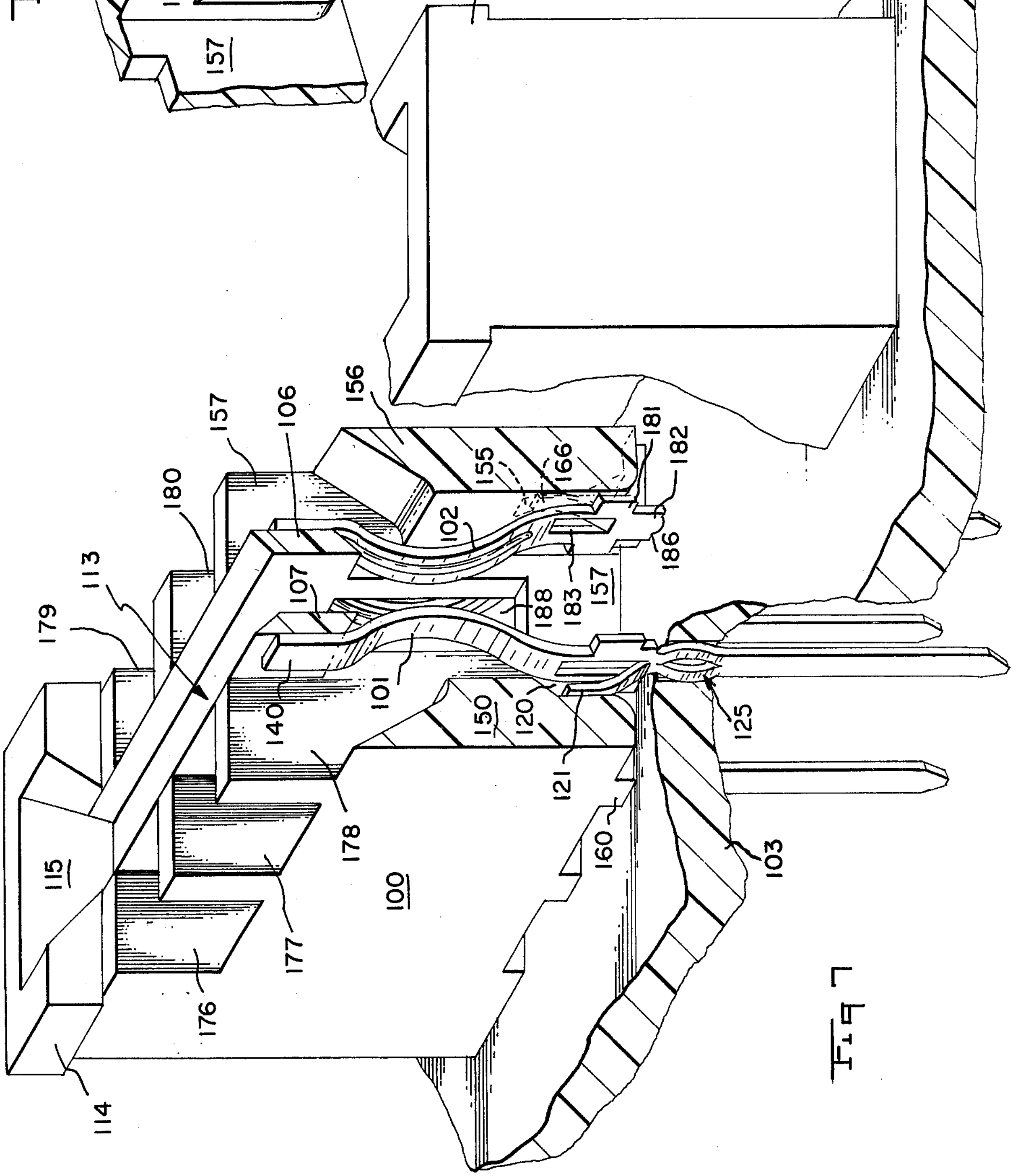

Reference is made to FIG. 8 which shows in detail the shape of the slot 155 in the housing wall 156.

Figures 9, 10, 11, 12, 13:
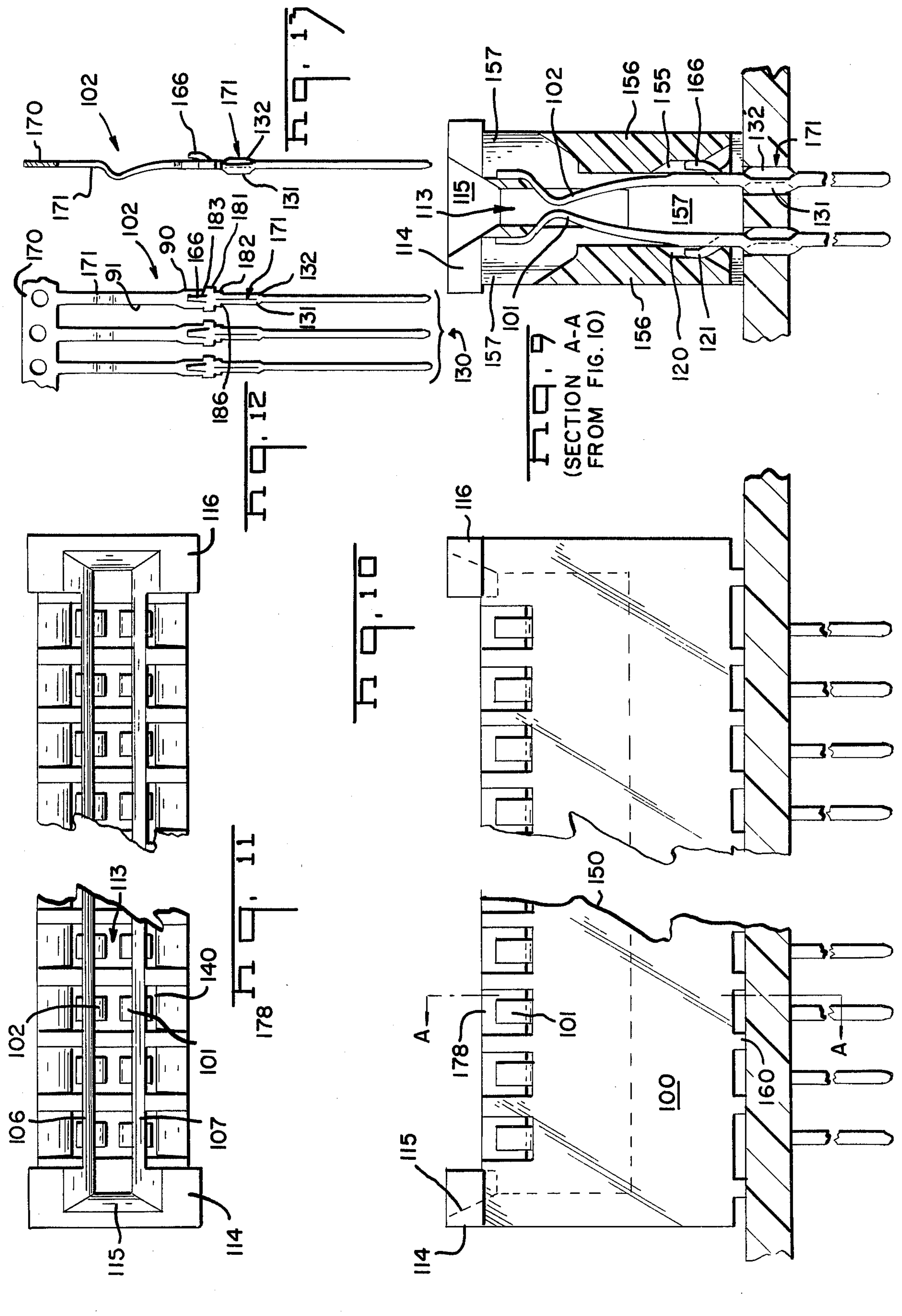
FIG. 9 is a sectional view of a pair of contacts within the connector housing and illustrating in detail how the tang of each of the two contacts fit into the slots provided therefor in the housing wall.
FIG. 10 is a side view of the connector and also shows where the section (A—A) of FIG. 9 is taken.
FIG. 11 is a top view of the connector employing the finger-like tang which fits into slots formed therefor in the housing wall rather than the embossments shown in FIG. 1.
FIG. 12 shows a plan view of several tang bearing contacts on a common carrier strip.
FIG. 13 is a side view of a tang bearing contact.

To more fully understand the relation between the contacts, the slots in the housing wall, and the tangs which enter the slots, reference is made to FIGS. 9, 12 and 13.

In FIG. 9 there is shown a cross-sectional view of the connector with tangs 121 and 166 inserted into slots 120 and 155 respectively. All of the contacts, such as contacts 101 and 102 have shoulders thereon in the vicinity of the tang 166 and also at the point where the contact rests upon the printed circuit board 103. The shape and purpose of these shoulders can be more clearly seen from FIG. 12.

In FIG. 12 a plan view of contact 101 is shown along with two other contacts, all connected to a common carrier strip 170, which is connected to the breakable notched portions 171. The purpose of the carrier strip 170 is to facilitate gang insertion of the contacts 130 into the printed circuit board.

Referring now specifically to the contact 102 in FIG. 12 the tang 166 can be seen to be stamped out of the contact itself, leaving a cut-out portion 183 in the contact. Also, the widened portions 181 and 182 can be seen. The bottom portion, or shoulder 186 of widened portion 182 seats upon the surface of the printed circuit board 103 in which the contact 102 is mounted. The function of the wider portion 181 is to bridge the width of tang receiving slots, such as slot 155 in FIGS. 7 and 8 and also to provide a shoulder for pushing the contacts into the apertures in the printed circuit board. Reference is made to FIG. 7 which shows widened portion 181 bridging slot 155. The widened portion 182 is made narrower than portion 181 to avoid the bridging of solder, when used, to a circuit path on the printed circuit board nearby the conductive path around the aperture in the circuit board, and a mechanical bridging to such nearby circuit path when solder is not employed to secure the contact in the circuit board aperture.

It should be noted that because of the difficulty of showing in a single view the manner in which a tang fits into its slot in the connector housing wall, both the contacts 101 and 102 will be referred to alternately herein. More specifically, in FIG. 7, the tang 121 of contact 101, and the profile of the socket 120 in which it fits, can be more clearly seen. In FIG. 8 the interior of socket 155, into which tang 166 of contact 102 fits, can be more clearly seen. In FIGS. 9, 12 and 13 it is more expedient to discuss the relationship of the tangs and the sockets in which the tangs fit, in connection with the contact 102 of FIG. 1. It will be understood however, that the contacts 101 and 102 and the tangs and sockets associated therewith are identical, except that they are mirror images of each other, and that a description of one is equally applicable to the other.

Referring again to FIG. 7 it can be seen that housing 100 is constructed somewhat differently than the housing 13 of FIG. 1. For example, the housing 100 of FIG. 7 has two raised end portions 114 and 116 with slanted walls, such as slanted wall 115, to facilitate entrance of the edge of the circuit card into the main housing slot 113.

Furthermore, the top edges of the outside walls 150 and 156 of housing 100 have cut-away portions therein, such as cut-away portions 176, 177, 178, 179 and 180 for example, and which function to expose the top ends of the contacts. Thus, cut-away portion 178 exposes the end 140 of contact 101 for access thereto for test probing and other purposes such as providing space for the contacts to flex back when a printed circuit board edge is inserted therebetween and also during insertion of an installation tool therebetween. It is also noted that tab-like element 140 of contact 101 rests behind a holding element 107 which extends along the entire length of the connector. The holding element 107, along with a mating holding element 106 on the other wall of the connector 100, functions to form the entrance of the U-shaped slot 113 into which the edge of a second printed circuit board (not shown) is inserted.

Each pair of contacts, such as contacts 101 and 102, is separated from adjacent pairs by partitions or dividers, such as divider 157 which has a slot 188 formed therein. Such slot 188, in combination with holding means comprising elements 107 and 106 mentioned above, and the end portions 114 and 166, together define the U-shaped slot into which the edge of the second printed circuit board (not shown) is inserted. As the edge of the second printed circuit board is inserted into the slot 113, contacts printed along said second PCB edge, at appropriate spots thereon, will make contact with the pairs of contacts, such as the pair of contacts 101 and 102, in much the same manner as discussed in connection with FIG. 1.

In FIG. 7 the contacts, such as contact 101, have split portions such as split portion 125 in contact 101. This split portion is more clearly shown in the contact 102 of FIGS. 12 and 13. Such split portion is identified by reference character 171 and comprises a pair of legs 131 and 132 which are bent to assume an offset position with respect to each other and then pressfit into an aperture in the receiving circuit board. The cross-sectional dimensions of the offset legs 131 and 132 in the split portion 171 of the contact 102 is greater than the diameter of the receiving aperture in the printed circuit board, thereby enabling the printed circuit board to mechanically securely grip the split portion 171 of the inserted terminal and rigidly secure it, and also to make good electrical contact therewith. If desired, the terminal 102 can then be conventionally soldered, sweat soldered, or secured by other appropriate means into the hole in the printed circuit board.

Referring now to FIGS. 10 and 11 there is shown respectively a side view and a top view of the connector. In the top view of FIG. 11, which looks down into the slot 113, the ends of the connectors, such as connectors 101 and 102, can be seen. The holding elements 106 and 107 behind which the flanges or tabs, such as tabs 140 of connector 101, are secured.

In FIG. 10 it can be seen how the contacts can be accessed through the breakaway portions on the top of the housing wall. More specifically, the contact 101 can be accessed through the opening 179 in the top of the housing wall 150.

In order to mount the connector more securely, and with no rocking effect, upon the surface of the printed circuit board, the connector is fitted with stand-offs, such as stand-off 160 in FIG. 10. These stand-offs, are, in fact, extensions of the dividers, such as divider 157 shown in FIG. 1.

It is to be noted that the contacts, such as contacts 101 and 102 can be either bifurcated, as contact 102, or solid, as contact 101 is. The contacts of the structure of FIG. 1 can also be bifurcated or solid.

Referring again to the contact 102 of FIG. 12 the width of the section 90 can be wider than the width of the portion 91 in order to compensate for the stamped out section 183 and to retain a fairly uniform strength throughout the length of the contact.

Figures 14, 15, 16, 17:
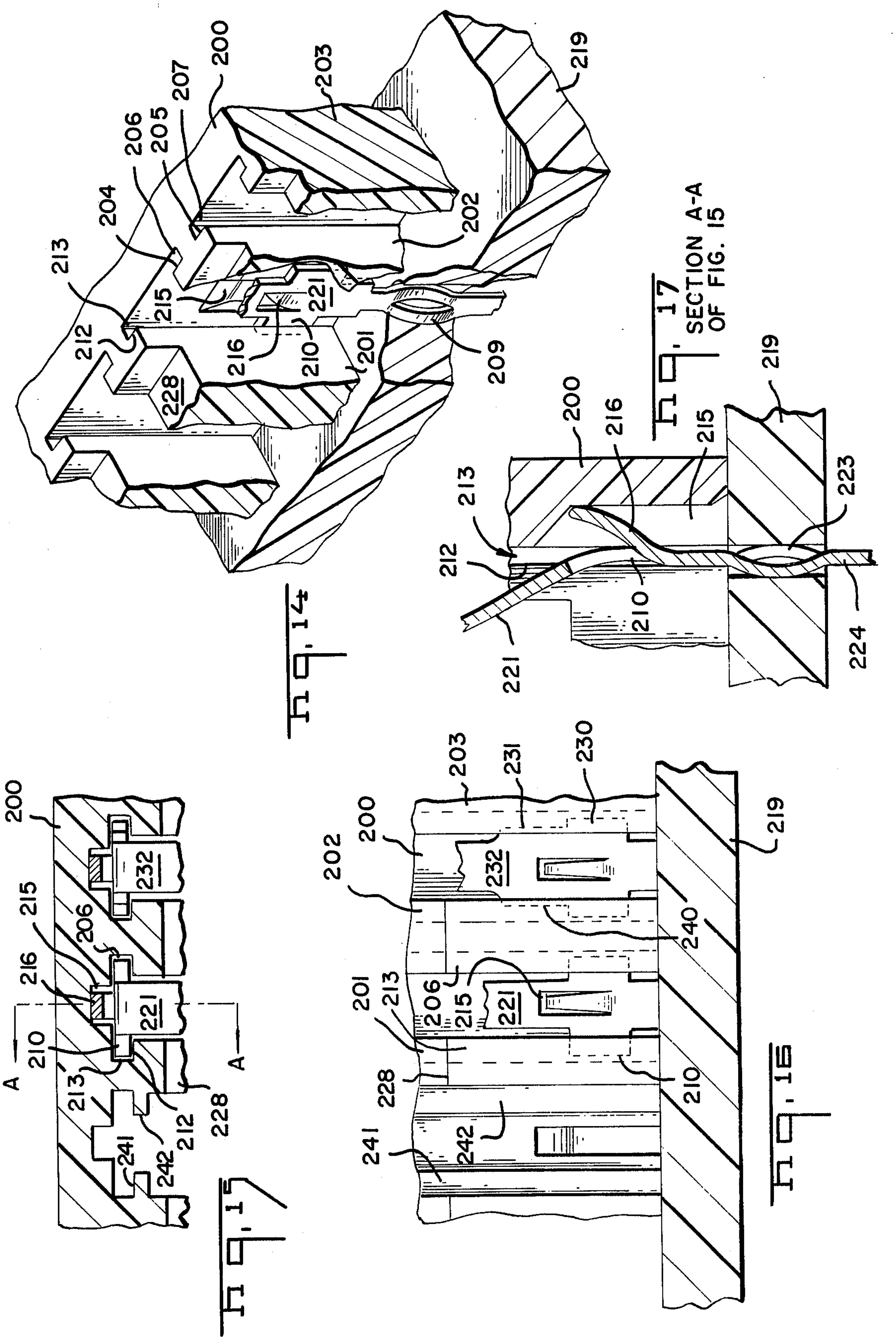
FIG. 14 is a perspective view of a form of the invention wherein the partitioning walls form a slot where they meet the connector housing side walls to retain a widened portion of the contacts near the base of said contacts.
FIG. 15 is a top view of the structure of FIG. 14.
FIG. 16 is a side view of the structure of FIG. 15.
FIG. 17 is a sectional view of FIG. 15 taken along the plane A—A.

Referring now to FIG. 14 there is shown another form of the invention wherein the widened portion 210 of contact 221 fits fits into a pair of slots 213 and 204 formed where the two partitioning walls 201 and 202 meet with the side wall 200 of the main housing of the connector. It is to be noted that only a small portion of the connector is shown in FIG. 14 and it is shown mounted on a small portion of printed circuit board 219.

The connector 221 of FIG. 14 has a tang 216 formed therein which extends into a cavity 215 in much the same manner as the tang 121 of FIG. 7 fits into slot 120.

The force of the tang 216 against the back wall of the slot 215 forces the contact 221 away from side wall 200 of the housing. As said contact 221 is forced away from wall 200 the ends of the widened portion 210 of said contact 221 bear against the shoulders or blocking elements 212 and 204 formed by slots 213 and 206 as described above.

By limiting the movement of the contact in this manner, damage to said contact where it joins the printed circuit board 219 is prevented.

Further, because the tang 216 forces the widened portion 210 of contact 221 against shoulders 212 and 204 the contact can be installed and retained in the housing before it is installed in the printed circuit board 219. In fact, the housing of FIG. 14 can be completely loaded with contacts before the contacts are press fitted or otherwise secured in the printed circuit board.

In many applications it is important that the finger-like tang elements 216 exert enough pressure on the contact to force it firmly against the mating contacts of a printed circuit board inserted therein. However, in attaining such a degree of force against the inserted printed circuit board, the contact 221 would likely be damaged by bending at the base thereof in the absence of the restraining effect produced by the blocking shoulders 212 and 204 against the ends of widened portion 210 of the contact 221.

When the printed circuit board is inserted in the connector, a sufficient force in application to that produced by tang 216 is supplied against the contacting surface of contact 221 to move the widened portion 210 thereof back away from the blocking shoulders 212 and 204, thereby permitting full force effect created by tang 216 against the back wall of slot 215 to be exerted against the printed circuit board (not shown) inserted into the connector.

Referring now to FIG. 15, there is shown a top view of the structure of FIG. 14 with similar parts being identified by the same reference character. In FIG. 15 the extension of widened portion 210 of connector 221 into the slots 213 and 206 can easily be seen. In addition, to the contact 221, there is also another contact 232 shown in FIG. 15. This second contact 232 in FIG. 15 is not shown in FIG. 14 for purposes of clarity in FIG. 14.

Also in FIG. 15 an alternative way of blocking or limiting the movement of the contact is shown. More specifically, protruding ledges 241 and 242 can be employed to limit contact movement rather than simply narrowing the thickness of the partitioning walls.

Referring now to FIG. 16 there is shown a front view of the structure of FIG. 15. The extension of the widened portion 210 of contact 221 into the slots 213 and 206 can again be seen. Also, in FIG. 16 the side view of the contact 232 can be seen. The configuration of contact 232 is different than that of contact 221 in that a much longer section of widened portion extends into the slots formed by the junction of the partitioning walls 202 and 203 with the rear wall 200 of the main connector housing. More specifically, it can be seen that widened portion 230, and also the portions 231 and 240 all extend into the slots formed at the junction of the partitioning walls 202 and 203 and the main housing wall 200. The widened portions 231 and 240 can extend into the housing slots as far as widened section 230.

Referring now to FIG. 17 there is shown a sectional view taken along the plane A—A of FIG. 15. In FIG. 17, the position of the tang 216 in the slot 215 in housing 200 can be clearly seen. Also in FIG. 17 it is readily apparent how the shoulders 212 and 213 provide a stop for the widened portion of the contact 221 as the tang 216 pushes said contact 221 to the left in FIG. 17.

It is to be understood that the form of the invention shown and described herein is but a preferred embodiment thereof and that various modifications and changes can be made in physical configuration and proportions without departing from the spirit and scope of the invention.

We claim:

1. The combination of a first board and a connector means for connecting said first board to a second board and comprising:

a plurality of pairs of contacts with each contact having first and second ends thereof, with said first end secured in said first board and with said pairs of contacts being arranged to form two parallel rows of contacts with each row including one of the contacts of each pair of contacts;

each of said contacts comprising a tab-like portion at the second end thereof and extending away from said first board, a "C" shaped portion between said first end and said second end, and convex protuberances between the said first end and said "C" shaped portion and on the same side of said contact as the open side of said "C" shaped portion;

to two contacts of each pair of contacts being positioned opposite each other with the closed sides of said "C" shaped portions facing each other and spaced apart a distance less than the thickness of said second board; and a detachable connector housing means constructed to be pressed over said pairs of contacts mounted in said first board to enclose said pairs of contacts and comprising side walls and a plurality of holding elements secured to said side walls, with said holding elements positioned to spread apart the tab-like portions on the contacts of each pair of contacts to prestress said contacts;

said detachable connector housing means further constructed to have its inner side walls press against said convex protuberances on the contacts of each pair of contacts to force said contacts towards each other to increase the effective length of securement of said first end of said contacts and to enhance said prestressing of said contacts;

said detachable connector housing means further constructed to be retained in its position enclosing said pairs of contacts by frictional engagement between said detachable connector housing means and said pairs of contacts, and to be removable from said contacts without removing said contacts from said first board.

2. A combination as in claim 1 in which said convex protuberances comprise finger-like tangs which extend outwardly from said contacts and press into the inner side walls of said detachable connector housing means.

3. A combination as in claim 2 in which said detachable connector housing means comprises:

blocking means fixed with respect to said detachable connector housing means and extending in front of that side of each contact opposite the side from which said finger-like tang extends;

said blocking means being positioned between said first end of said contact and the "C" shaped portion thereof; and said blocking means further being positioned to be spaced apart from said contact when said second board is inserted in said connector means and to be in contact with said contact when said second board is not inserted in said connector means.

4. A combination as in claim 2 in which said detachable connector housing means comprises first slots formed in the side walls thereof which individually receive one of said finger-like tangs to provide additional structural support for said contacts and for maintaining said connector housing means secured over said contacts.

5. A combination as in claim 4 comprising:

partitioning walls positioned between said contacts and constructed to form second slot means adjacent the side wall of said detachable connector housing means;

said contacts each having a widened portion between said first end and said "C" shaped portion which extends into said second slot means to limit the movement of said contact away from the side wall of said detachable connector housing means.

6. A combination of a connector means and a first substrate for connecting said first substrate to a second substrate and comprising:

a row of contacts each comprising first and second ends joined together by a bowed portion and with said first emds being secured in said first substrate, and having a protuberance formed between the bowed portion and said first end and extending outwardly from said pair of contacts;

each of said contacts positioned with the convex side of said bowed portions facing in the same direction and in alignment;

a detachable housing means constructed to be pressed over said contacts while said contacts are secured in said first substrate and comprising:

first and second side walls;

the first of said side walls constructed to press against said protuberances to increase the effective length of securement of said first ends of said contacts and to force said contacts towards the other wall of said detachable housing means;

holding elements constructed and positioned to force the second ends of said contacts back towards said first side wall;

means for securing said holding elements to one of said side walls; and a first slot formed between said side walls to enable entry of said second substrate therein and into contact with the convex sides of said bowed portions of said contacts;

said detachable housing means further constructed to be retained in its position over said pairs of contacts by frictional engagement between said detachable housing means and said contacts, and to be removable from said first substrate without receiving said contacts from said first substrate.

7. A combination as in claim 6 in which said protuberances comprise tangs extending outwardly from said contacts and press against the side walls of said detachable housing means.

8. A combination as in claim 7 comprising:

partitioning walls positioned between said contacts and constructed to form second slots adjacent the side wall of said detachable housing means;

said contacts each having a widened portion between said first end and said bowed portion which extends into the said second slot in the adjacent partitioning walls to limit the movement of said contact away from the side wall of said detachable housing means.

9. A combination as in claim 7 in which said detachable housing means comprises:

blocking means fixed with respect to said detachable housing means and extending in front of that side of each contact opposite the side from which said tang extends;

said blocking means being positioned between said first end of said contact and the bowed portion thereof;

said blocking means further being spaced apart from said contact when said second substrate is inserted in said connector means and to be in contact with said contact when said second substrate is not inserted in said connector means.

10. A combination as in claim 7 in which said detachable connector housing means comprises second slots formed in the side walls thereof which individually receive one of said tangs to provide additional structural support for said contacts and for maintaining said detachable housing means secured upon said contacts, partitioning wall positioned between said contacts and constructed to form third slots adjacent the side wall of said detachable housing means;

said contacts each having a widened portion between said first end and said bowed portion which extends into said third slots to limit the movement of said contact away from the side wall of said detachable housing means.

11. A combination as in claim 7 in which said detachable connector housing means comprises second slots formed in the side walls thereof which individually receive one of said tangs to provide additional structural support for said contacts and for maintaining said detachable housing means secured upon said contacts;

blocking means extending in front of that side of each contact opposite the side from which said tang extends, and positioned between said first end of said contact and the bowed portion thereof.

said blocking means further being spaced apart from said contact when said second substrate is inserted in said connector means and to be in contact with said contact when said second substrate is not inserted in said connector means.

* * * * *